(12) United States Patent
Klein (10) Patent No.: US 9,341,657 B2
(45) Date of Patent: May 17, 2016

(54) CURRENT SENSOR AND PRINTED CIRCUIT BOARD FOR THIS SENSOR

(75) Inventor: Philippe Klein, Saint Pierre d'Allevard (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 76 days.

(21) Appl. No.: 14/343,143

(22) PCT Filed: Sep. 6, 2012

(86) PCT No.: PCT/EP2012/067455
§ 371 (c)(1),
(2), (4) Date: Mar. 6, 2014

(87) PCT Pub. No.: WO2013/034661
PCT Pub. Date: Mar. 14, 2013

(65) Prior Publication Data
US 2014/0210463 A1     Jul. 31, 2014

(30) Foreign Application Priority Data

Sep. 7, 2011 (FR) .................................. 11 57938

(51) Int. Cl.
*G01R 33/04* (2006.01)
*G01R 19/00* (2006.01)
(Continued)

(52) U.S. Cl.
CPC .......... *G01R 19/0092* (2013.01); *G01R 15/185* (2013.01); *G01R 33/00* (2013.01);
(Continued)

(58) Field of Classification Search
CPC .... G01R 19/0092; G01R 33/00; G01R 33/04; G01R 15/185; G01R 33/045; G01R 33/05; G01R 33/0052; H01F 5/00; H01F 5/02; H05K 2201/086; H05K 2201/09063; H05K 2201/092363; H05K 2201/09672; H05K 2201/097; H05K 2201/10151
USPC ............. 324/117 R, 127, 244, 249, 253, 254, 324/258, 260, 263, 654, 117 H; 361/748; 336/180, 200, 229; 335/299; 310/154.45
See application file for complete search history.

(56) References Cited

U.S. PATENT DOCUMENTS 7,372,261 B2    5/2008   Choi et al.
2002/0070831 A1   6/2002   Harding
(Continued)

FOREIGN PATENT DOCUMENTS

| DE | 10354694 | 6/2005 |
| EP | 2108965 | 10/2009 |
| WO | WO02/25797 | 3/2002 |

OTHER PUBLICATIONS

O'Donnell et al. "Planar fluxgate current sensor integrated in printed circuit board" Sensors and Actuators A 129 20-24 (2006).

*Primary Examiner* — Arleen M Vazquez
*Assistant Examiner* — Steven Yeninas
(74) *Attorney, Agent, or Firm* — Occhiuti & Rohlicek LLP (57) ABSTRACT

A printed circuit includes a hole, a stack, one or more first coils, a magnetic core, and a pad. The hole passes through the vertically through the board to receive a conducting wire. The stack comprises metallization layers vertically stacked and separated mechanically from one another by electrically insulating layers. The first coils fulfill functions of a measurement coil and of an excitation coil. Each first coil has turns wound solely around the magnetic core. The magnetic core forms a first magnetic ring surrounding the hole and extending horizontally between metallization layers. Each turn of each first coil is formed by two conducting tracks produced, respectively, in metallization layers situated above and below the first magnetic ring. The pad passes through an insulating layer and passes through an interior of the magnetic ring, electrically linking the two conducting tracks.

5 Claims, 7 Drawing Sheets

(51) Int. Cl.
*G01R 33/00* (2006.01)
*G01R 33/05* (2006.01)
*G01R 15/18* (2006.01)
*H05K 1/16* (2006.01)
*H01F 38/30* (2006.01)
*H05K 1/02* (2006.01)
*H05K 3/46* (2006.01)
*H01F 27/28* (2006.01)

(52) U.S. Cl.
CPC ............ *G01R33/0052* (2013.01); *G01R 33/04* (2013.01); *G01R 33/045* (2013.01); *G01R 33/05* (2013.01); *H01F 38/30* (2013.01); *H05K 1/165* (2013.01); *H01F 2027/2809* (2013.01); *H05K 1/0239* (2013.01); *H05K 3/46* (2013.01); *H05K 2201/086* (2013.01); *H05K 2201/097* (2013.01); *H05K 2201/09063* (2013.01); *H05K 2201/09263* (2013.01); *H05K 2201/09672* (2013.01); *H05K 2201/10151* (2013.01)

(56) References Cited

U.S. PATENT DOCUMENTS

| | | |
|---|---|---|
| 2003/0011458 A1 | 1/2003 | Nuytkens et al. |
| 2008/0218302 A1* | 9/2008 | Volker et al. .................. 336/200 |
| 2009/0256580 A1* | 10/2009 | Heckleman et al. ........... 324/654 |
| 2011/0006753 A1* | 1/2011 | Yu et al. ..................... 324/117 R |
| 2011/0108317 A1* | 5/2011 | Harrison et al. .............. 174/266 |
| 2011/0140718 A1* | 6/2011 | Eberheim et al. ............. 324/654 |

* cited by examiner

CURRENT SENSOR AND PRINTED CIRCUIT BOARD FOR THIS SENSOR

RELATED APPLICATIONS

This application is the national stage entry of PCT/EP2012/067455, filed on Sep. 2, 2012, which claims the benefit of the Sep. 7, 2011 priority date of French application FR 1157938, the contents of which are herein incorporated by reference.

FIELD OF DISCLOSURE

The invention relates to a current sensor and a printed circuit for such a current sensor.

BACKGROUND

A printed circuit, also known by the acronym PCB (Printed Circuit Board), is a support that makes it possible to electrically link a set of electrical components. Such a printed circuit generally takes the form of a laminated plate. This printed circuit can be single-layer or multi-layer.

A single-layer printed circuit comprises only a single metallization layer in which are printed conductive tracks that electrically connect the different electrical components together. A multilayer printed circuit comprises, on the other hand, a plurality of metallization layers, that is to say at least two layers and, preferably, more than four or six layers. Hereinafter in this description, these multilayer printed circuits will be the focus of interest.

A metallization layer is one of the layers of the laminated plate forming the printed circuit in which are produced one or more conductive tracks that electrically connect the different electrical components together. This layer is planar and extends parallel to the plane of the laminated plate. Generally, the metallization layer is obtained by depositing a uniform layer of a conductive material, typically a metal such as copper, then etching this uniform layer to leave only the conductive tracks remaining.

The different metallization layers of the printed circuit are spaced apart mechanically from one another by insulating layers made of electrically insulating material. This insulating material exhibits a high dielectric strength, that is to say typically greater than 3 MV/m and, preferably, greater than 10 MV/m. For example, the electrically insulating material is produced from epoxy resin and/or glass fiber. The insulating layer generally takes the form of a rigid plate produced in a material that does not become viscous during its assembly with other layers. For example, it is produced from a thermosetting resin that has already undergone an irreversible thermosetting process.

The different layers of the multilayer printed circuit are assembled together, with no degree of freedom, using adhesive layers familiarly called "prepreg."

A prepreg consists of a thermosetting resin impregnating, generally, a reinforcement such as a fabric. Typically, the resin is an epoxy resin. During the fabrication of the printed circuit, the transformation of the thermosetting resin involves an irreversible polymerization that transforms the prepreg into a solid and rigid material that irreversibly bonds together the different layers of the printed circuit. Typically, each transformation occurs when the prepreg is heated to a high temperature and is compressed with a high pressure. Here, a high temperature is a temperature greater than 100° C. and, preferably, greater than 150° C. A high pressure is a pressure greater than 0.3 MPa and, typically, greater than 1 MPa.

The conductive tracks of the different metallization layers can be electrically connected via conductive bump contacts or pads passing through the insulating layers. The conductive bump contacts or pads are better known as "vias." The vias generally extend at right angles to the plane of the layers. There are different ways of fabricating these vias. One of the most common ways is to produce a hole in the insulating layer or layers to pass through and then to cover the inner wall of these holes with a metal. These are called metalized holes.

A via does not necessarily pass through all the layers of the printed circuit. Thus, there are blind vias that emerge on a single outer face of the printed circuit. These days, it is also possible to produce "buried" vias for example, using known technologies such as the technology known by the acronym HDI (High Density of Integration). A buried via does not emerge on any of the outer faces of the printed circuit. For example, a buried via makes it possible to electrically connect conductive tracks produced in metallization layers embedded inside the printed circuit.

A known current sensor, is for example disclosed in O'Donnell, et al., "*Planar fluxgate current sensor integrated in printed circuit board*", Sensors and Actuators A 129 (2006) 20-24.

This current sensor operates well. For example, periodically saturating the magnetic core makes it possible to measure the contribution of the magnetic field $B_i$ generated by the current to be measured at high frequencies and increases the dynamic range of the sensor. High frequency means a frequency of greater than 100 Hz and, preferably, greater than 1 kHz. This measurement technique is known by the term "fluxgate sensor." However, for this sensor to operate well, it is necessary to be capable of precisely compensating for the contribution of the magnetic excitation field $B_{ex}$ generated inside the core by the excitation coil. Accordingly, the conducting wire must be positioned precisely with respect to the magnetic core. This problem has been solved in known sensors by producing a conducting track in the printed circuit and in which the current to be measured flows. Indeed, with present-day technologies, it is possible to position a conducting track of a printed circuit very precisely. However, when using this sensor, it is necessary to link the conducting wire to this conducting track of the printed circuit. This makes it necessary to provide for connection terminals on the printed circuit, thereby increasing the bulk of the current sensor. This also requires systematic cutting of the conducting wire in which the current to be measured flows, this not always being desirable.

SUMMARY

The invention is aimed at remedying at least one of these drawbacks. Its subject is therefore a current sensor in which: the printed circuit comprises a hole passing right through it along a vertical axis to receive the conducting wire, the magnetic core forms a first magnetic ring surrounding the hole and extending horizontally between metallization layers, and each turn of each first coil is formed by two conducting tracks produced, respectively, in metallization layers situated above and below the first magnetic ring and linked electrically to one another by a via passing through the center of this magnetic ring.

In the sensor hereinabove, the wire in which the current flows does not need to be linked to a conducting track of the printed circuit. It suffices simply for it to pass through the hole in order for the sensor to be able to operate.

Moreover, the fact that the magnetic ring surrounds the hole makes it possible to render this sensor much more insensitive to errors of positioning of the conducting wire in this hole. Indeed, the magnetic ring channels the magnetic field generated by the current inside the magnetic ring. Thus, it is not necessary for the wire to be positioned as precisely inside the hole.

The coils are formed by conducting tracks produced in the metallization layers and by vias, thereby facilitating the fabrication of this sensor.

Finally, this sensor still operates according to the principle of a "fluxgate" thereby making it possible to preserve, or indeed to improve, its precision.

The subject of the invention is also a printed circuit for producing the sensor hereinabove.

In some embodiments the printed circuit comprises: an annular cavity inside which is housed the magnetic ring, with the transverse dimensions, that is to say in a vertical plane, of the magnetic ring being at least 5 µm smaller than the corresponding transverse dimensions of the cavity so as to leave a clearance between the walls of this cavity and the faces opposite of the magnetic ring.

In other embodiments, the sensor or the circuit comprises at least one second magnetic ring surrounding the same hole and extending horizontally between metallization layers, one or more second coils fulfilling the functions of measurement coil and of excitation coil, each second coil being provided with turns wound solely around the second magnetic ring, each turn of each second coil being formed by two conducting tracks produced, respectively, in the metallization layers situated above and below the second magnetic ring and linked electrically to one another by a pad passing through an insulating layer and passing through the interior of this second magnetic ring, and the first and second measurement coils are linked in series so as to decrease the contribution of the magnetic excitation field in the current generated by these measurement coils.

In other embodiments, the first and the second excitation coils are arranged so as to generate a magnetic excitation field in the interior, respectively, of the first and second magnetic rings of the same intensity when they are supplied by the same excitation current, and the first and second measurement coils are arranged so as to measure the same magnetic field, respectively, in the first and second rings in the absence of magnetic excitation field.

In yet other embodiments, the first and second excitation coils are identical and the first and second measurement coils are identical except that they are wound, respectively, around the first and second magnetic rings.

Among the advantages of at least some of the foregoing embodiments is that a clearance between the magnetic ring and the walls of the cavity makes it possible to increase the precision of the sensor since the magnetic ring is then not stressed mechanically by the printed circuit.

Yet another advantage arises from using two magnetic rings and linking the measurement coils in series makes it possible to easily compensate the magnetic excitation field.

Another advantage arises from arranging the excitation coils so that they generate magnetic excitation fields of the same intensity and of opposite direction facilitates the compensation of these fields in the measurement.

Additionally, the use identical excitation and measurement coils facilitates the production of the sensor.

BRIEF DESCRIPTION OF THE DRAWINGS

The invention will be better understood on reading the following description, given solely as a nonlimiting example and with reference to the drawings in which.

In these figures, the same references are used to designate the same elements.

DETAILED DESCRIPTION

Hereinafter in this description, the features and functions that are well known to a person skilled in the art are not described in detail.

Figure 1:
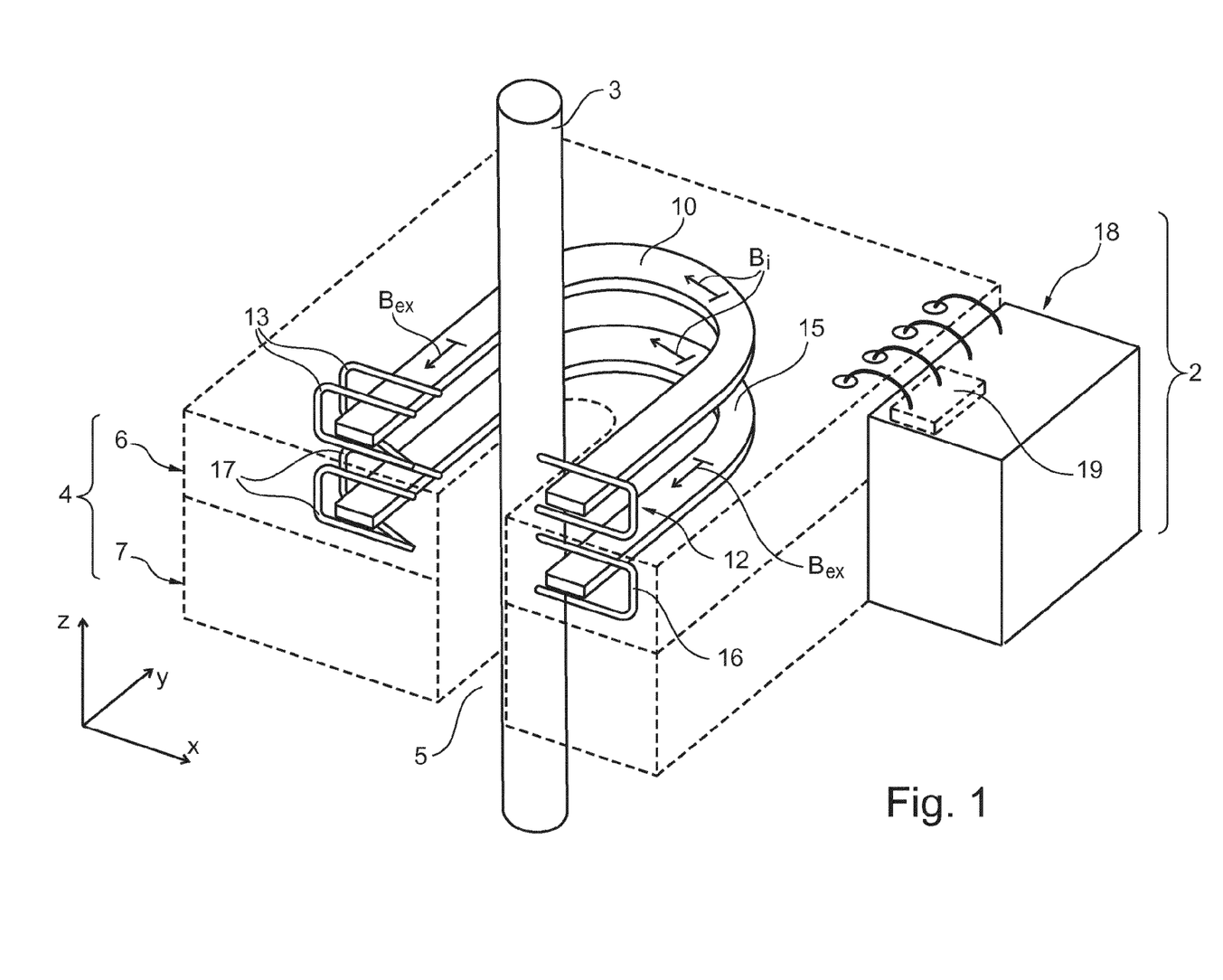
FIG. 1 is a schematic illustration, in cross section and in perspective, of a current sensor.

FIG. 1 represents a current sensor 2 suitable for measuring the intensity of the current circulating in a conductor wire 3.

The sensor 2 comprises a superposition 4 of a plurality of printed circuits in which is formed a hole 5 passing through this superposition 4 from side to side in a vertical direction Z.

The wire 3 is received in the hole 5. To this end, the transversal dimensions of the hole 5 say in a horizontal plane, are typically greater by at least 100 µm than the outer diameter of the wire 3.

Here, a stack, in the direction Z, of two printed circuits 6 and 7, forms the superposition 4. These printed circuits are fastened one on top of the other with no degree of freedom. The outline of these circuits is represented by broken lines to allow the various elements of which they are composed to show.

The circuit 6 comprises a stack, in the direction Z, of a plurality of metallization layers mechanically separated from one another by insulating layers. The different layers of this circuit 6 extend horizontally parallel to orthogonal directions X and Y.

The circuit 6 comprises a magnetic core that surrounds the hole 5. This core is a magnetic ring 10 that extends essentially in a horizontal plane.

To increase the sensitivity of the sensor 2, the magnetic ring 10 is made of a magnetic material exhibiting a static relative permeability, that is to say for a zero frequency, greater than 1,000 and, preferably greater than 10,000. For this, the magnetic ring 10 is made of a magnetic material naturally exhibiting a strong relative permeability. For example, the magnetic ring 10 can be made of a ferromagnetic material, such as a mu-metal or a magnetic material, including those known by the marketing name of VITROVAC® 6025.

Preferably, the center of the ring 10 is centered on the hole 5.

An excitation coil 12, which is intended to be passed through by an excitation current $i_{ex}$ at a frequency $f_{ex}$, is wound around the ring 10. This coil 12 generates, inside the ring 10, an excitation magnetic field $B_{ex}$ that periodically saturates this ring.

Preferably, the coil 12 extends over the entire length of the ring 10. The "length of the ring 10" here designates the perimeter of the magnetic ring in the horizontal plane. Each turn of this coil passes through the interior of the ring. To simplify FIG. 1, only one turn of the coil 12 is represented.

The printed circuit 6 also comprises a measurement coil 13 intended to measure the intensity of the magnetic field inside the ring 10. This coil 13 is wound around the excitation coil 12. To simplify FIG. 1, only two turns of this coil 13 are represented. Each turn passes through the center of the ring 10. This coil 13 extends over the entire length of the magnetic ring 10. Hereinafter in this description, the measurement of this coil 13 is given by the following relationship: $M_1 = B_i + B_{ex}$, in which:

$M_1$ is the measurement of the coil 13,
$B_i$ is the magnetic field generated by the current i that circulates in the wire 3, and
$B_{ex}$ is the excitation magnetic field.

To write this formula, it is assumed that the sign of the magnetic field is positive when this magnetic field rotates inside the ring 10 in the counterclockwise direction.

The use of a magnetic ring makes it possible to automatically compensate for the external magnetic field influence, which is uniform over the entire surface of the printed circuit 6. As used herein, "compensate" designates the action of eliminating or of greatly reducing the contribution of a magnetic field in measuring the intensity of the current i. For example, this makes it possible to automatically compensate for the influence of the Earth's magnetic field.

The printed circuit 7 is the symmetrical counterpart of the printed circuit 6 relative to a horizontal plane, except that the excitation coil is here wound in the reverse direction. The magnetic ring, the excitation coil and the measurement coil of the printed circuit 7 are respectively given the references 15, 16 and 17. The coil 16 is powered by the same excitation current i as the excitation coil 12. In these conditions, the measurement of the coil 17 is given by the following relationship: $M_2 = B_i - B_{ex}$, in which $M_2$ is the measurement of the coil 17.

Here, the coils 13 and 17 are connected in series to automatically compensate for the contribution of the excitation magnetic field $B_{ex}$. As used herein, "compensate" designates the fact of best eliminating the influence or the contribution of this magnetic field $B_{ex}$ in the final result, that is to say, here, in the measurement of the current. With the sign conventions adopted here, the coils 13 and 17 are connected in such a way as to add together the measurements $M_1$ and $M_2$.

The sensor 2 also comprises an electronic processing unit 18 connected to the superposition 4 via wired links. This unit 18 processes the measurements obtained from the coils 13 and 17 to obtain a measurement of the intensity of the current i that circulates in the wire 3. The unit 18 also includes a current source 19 suitable for generating the excitation current $i_{ex}$ that circulates in the coils 12 and 16.

Figure 2:
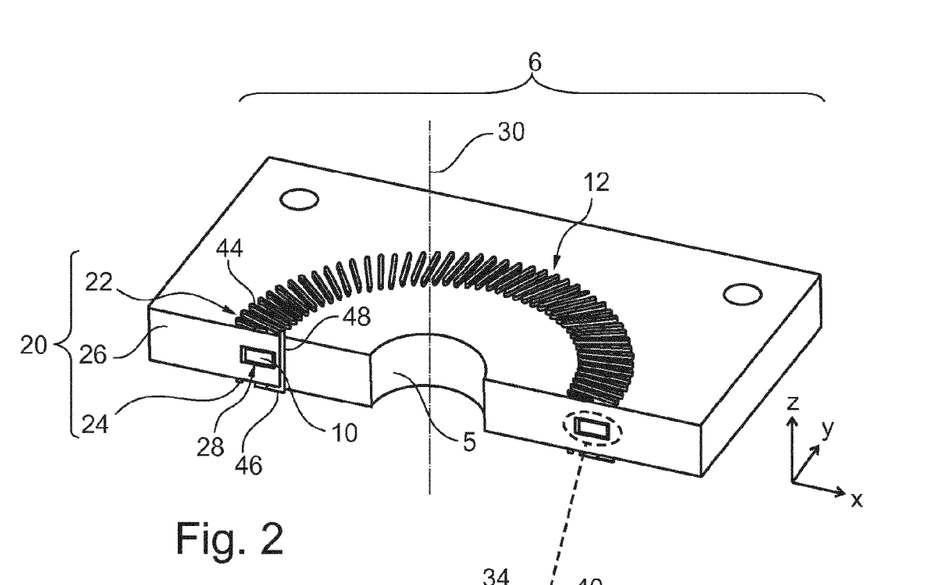
FIG. 2 is a schematic illustration, in cross section and in perspective, of a printed circuit used to produce the sensor of FIG. 1.

FIG. 2 represents, in more detail, the printed circuit 6 used to produce the sensor 2. FIG. 2 represents a cross section of the printed circuit 6 to show the details that are embedded inside this printed circuit.

The printed circuit 6 is a multilayer printed circuit. It is therefore formed by a stack 20, in the vertical direction Z, of a plurality of metallization layers separated by insulating layers. In FIG. 2, only two metallization layers 22 and 24 separated by one insulating layer 26 are represented. This stack 20 is described in more detail in relation to the subsequent figures.

A cavity 28 is hollowed out in the insulating layer 26 to receive the magnetic ring 10. The cavity 28 and its details are more visible on the enlarged portion of the cross section of the printed circuit represented in FIG. 2A. Here, the cavity 28 is annular. It is situated between the two metallization layers 22 and 24. This cavity admits a vertical axis of symmetry 30. The axis 30 is also an axis of symmetry for the hole 5. This cavity has a rectangular transversal section. A transversal section is the section contained in a vertical plane containing the axis 30. More specifically, the cavity 28 has an outer vertical wall 32, an inner vertical wall 33, a flat roof 34 and a flat bottom 36. The vertical walls 32 and 33 are circular. The transversal section of the cavity is constant over its entire length. The length of the cavity is its perimeter, for example internal, in a horizontal plane.

Figure 2A:
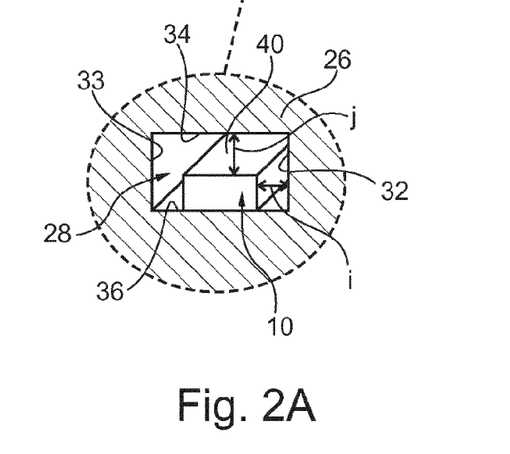
FIG. 2A is a schematic illustration of the enlargement of a detail of FIG. 2.

The magnetic ring 10 is housed inside the cavity 28. The axis of revolution of the ring 10 is merged with the axis 30. The transversal section of the magnetic ring 10 is also rectangular. This transversal section is also constant over the entire length of the ring 10.

In order to increase the static relative permeability, the thickness e in the direction Z of the core is as small as possible. For example, the core has a thickness that is typically less than 250 μm and preferably less than 125 μm or 25 μm. Its width l in a radial direction is typically between 0.5 mm and 10 mm. For example, here, the width l is between 1 and 2 mm.

The magnetic ring 10 has an inner face that rests on the bottom 36 of the cavity 28, for example only under the action of the force of gravity. The ring 10 also has a top face 40 facing the roof 34 of the cavity 28 and outer and inner vertical faces respectively facing the vertical walls 32 and 33.

The dimensions of the transversal section of the ring 10 are less than the corresponding dimensions of the transversal section of the cavity 28. Thus, its width l and its thickness e are less, respectively, than the width and the thickness of the cavity 28. This makes it possible to separate the ring 10 from the vertical walls 32 and 33 by a lateral gap i and to separate the top face 40 of the ring 10 from the roof 34 by a gap j. The gaps i and j are greater than 5 μm and, preferably greater than 100 μm. Thus, in these conditions, the cavity 28 exerts no mechanical stress on the ring 10. The fact that the ring 10 is not mechanically stressed increases the accuracy of the sensor 2 because that limits the modifications of its magnetic properties.

The circuit 6 also comprises the coils 12 and 13. To simplify the representation, only the turns of the coil 12 are represented. For example, these turns are evenly arranged at regular intervals over the entire length of the ring 10.

Each turn of the coil 12 is formed by: a conductive track 44 produced in the metallization layer 22, and a conductive track 46 produced in the metallization layer 24.

Each turn also comprises a vertical via 48 electrically linking the ends of the tracks 44 and 46 of one and the same turn. The other end of the conductive tracks is also connected by another vertical via to the end of a conductive track of an adjacent turn.

Figure 3:
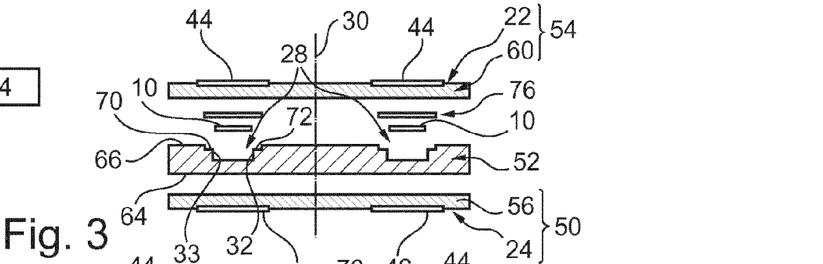
FIG. 3 is a schematic illustration, in cross section and in an exploded view, of a first embodiment of the printed circuit of FIG. 2.

FIG. 3 represents a first embodiment of the printed circuit 6 in an exploded view. In this embodiment, the stack 20 is produced by stacking, from bottom to top: a metalized prepreg 50, an insulating layer 52, and a metalized prepreg 54.

The metalized prepreg 50 comprises a prepreg 56 and the metallization layer 24 fixed onto the bottom face of the prepreg 56.

The metalized prepreg 54 comprises a prepreg 60 and the metallization layer 22 fixed onto a top face of the prepreg 60.

Here, the prepregs 56 and 60 are prepregs qualified as "standard." Standard prepregs have a low viscosity during the assembly of the printed circuit. "Low viscosity" denotes a viscosity less than 5,000 pascal-seconds and, preferably, less than 1,000 pascal-seconds at the glass transition temperature when the temperature of the prepreg is high according to the specifications of the manufacturer of this prepreg.

For example, the prepregs 56 and 60 can be produced in one of the following materials: FR-2 (phenolic paper cotton), FR-3 (epoxy resin, paper and cotton), FR-4 (woven glass fiber and epoxy resin), FR-5 (woven glass fiber and epoxy resin), FR-6 (coating of glass and polyester), G-10 (woven glass fiber and epoxy resin), CEM-1 (paper cotton and epoxy resin), CEM-2 (paper cotton and epoxy resin), CEM-3 (woven glass fiber and epoxy resin), CEM-4 (woven glass fiber and epoxy resin), CEM-5 (woven glass fiber and polyester). Here, these prepregs 56 and 60 are prepregs from the family of products under the reference 33N (for example, the prepreg of reference 33N2355) sold under the mark ARLON®.

The layer 52 is an insulating layer such as that described in the introduction to this patent application. For example, this layer 52 conforms to the FR-4 standard. It has a bottom face 64 facing the prepreg 56 and a top face 66 turned toward the prepreg 60. The prepregs 56 and 60 entirely cover, respectively, the faces 64 and 66. They are also directly deposited on these faces 64 and 66 and are therefore in direct contact without the intermediary of other layers.

The cavity 28 is hollowed out from the face 66 inside the layer 52. This cavity 28 therefore has a mouth that emerges in the face 66. This mouth forms two shoulders 70 and 72, respectively, at the top of the vertical walls 32 and 33 of the cavity 28. The depth of these shoulders 70 and 72 is given by the following relationship: p=h−e−j, in which:
  p is the depth of the shoulders 70, 72 measured in the Z direction,
  h is the depth of the cavity 28, measured in the Z direction.
  e is the thickness of the ring 10, and
  j is the vertical gap between the ring 10 and the roof 34 of the cavity 28.

The depths p and h are measured in the direction Z.

The printed circuit 6 also comprises an anti-creep cap 76 specifically for preventing the flow of the prepreg 60, by creep during the assembly, on the magnetic ring 10. To this end the cap 76 here takes the form of a circular ring the axis of revolution of which is merged with the axis 30. The inner diameter and the outer diameter of this cap 76 are chosen in such a way that they rest, respectively, on the shoulders 72 and 70. Thus, this cap 76 does not bear on the magnetic ring 10 when the printed circuit is assembled and therefore does not exert any mechanical stress on this magnetic ring 10.

The thickness of the cap 76 is less than or equal to the depth p of the shoulders 70 and 72. For example, the thickness of the cap 76 is less than the depth by at most 10%. Thus, after assembly, the cap does not form a protuberance beyond the top face 66.

The cap 76 is produced in a rigid material. As used herein, a rigid material is one with a Young's modulus that is greater than 2 GPa and preferably greater than 10 or 100 GPa. In this description, the values of the Young's modulus are given at a temperature of 20° C. For example, the cap 76 can be produced in FR-4.

For example, the cap 76 can be produced by cutting from a rigid plate. The cap 76 is produced in a non-magnetic material. As used herein, a non-magnetic material is one with a static relative permeability that is equal to 1.

Figure 4:
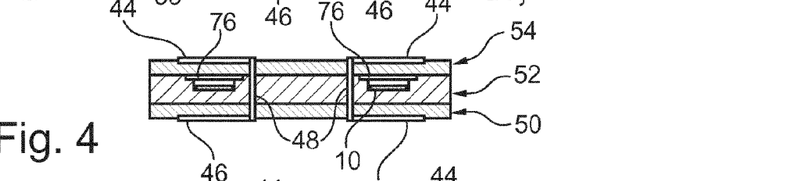
FIG. 4 is a schematic illustration in cross section of the printed circuit of FIG. 2.

FIG. 4 represents the same printed circuit as FIG. 3 but in an assembled position. Furthermore, in FIG. 4, the vertical vias 48 that link the tracks 44 to the tracks 46 are represented. Once assembled, the superposition of the layer 52 and of the prepregs 56 and 60 forms the insulating layer 26.

A method for fabricating the printed circuit 6 will now be described with reference to the method of FIG. 5.

In a step 80, the layer 52 is machined to form the cavity 28.

In parallel, in step 82, the magnetic ring 10 is fabricated independently of the fabrication of the layer 52. For example, the magnetic ring 10 is fabricated by cutting from a sheet of magnetic material.

In parallel with the step 82, in step 84, the cap 76 is also fabricated independently of the fabrication of the ring 10 and of the layer 52. For example, the cap 76 is fabricated by cutting from a panel of a rigid non-magnetic material.

Then, in step 86, the magnetic ring 10 is inserted into the cavity 28.

In step 88, the cap 76 is deposited on the shoulders 70 and 72 of the cavity 28.

In step 90, the metallization layers are assembled. To this end, in this embodiment, the metalized prepregs 50 and 54 are arranged, respectively, facing the faces 64 and 66 of the insulating layer 52. Then, the prepregs are heated to a temperature greater than or equal to 150° C. and, at the same time, a vertical pressure greater than 1 MPa is applied to the assembly of the layers to provoke the thermosetting of the prepregs 56 and 60. In this step, the prepregs 56 and 60 are transformed by polymerization into a rigid material that definitively bonds the metallization layers to the faces 64 and 66 of the insulating layer 52.

In step 90, the prepreg 60 creeps. However, the cap 76 prevents the prepreg from flowing to the magnetic ring 10 to form a composite with an anisotropic thermal expansion.

In step 92, the conductive tracks 44 and 46 are produced in the metallization layers, respectively, 22 and 24. For example, these tracks are produced by etching the metallization layers.

Then, in step 94, the vias are produced to electrically connect the different conductive tracks and thus form the coil 12. For example, the vias are produced by drilling holes and then metalizing the inner walls of these holes.

The steps 90 to 94 can be reiterated to add extra metallization layers in the stack.

Figure 6:
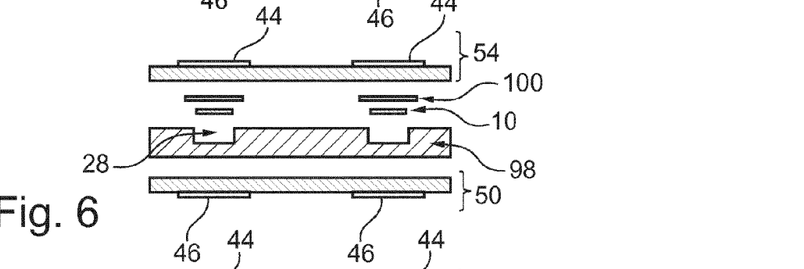
FIG. 6 is a schematic illustration, in cross section and in an exploded view, of a second embodiment of the printed circuit of FIG. 2.

FIG. 6 represents another embodiment of the printed circuit 6 in which the shoulders 70 and 72 are omitted. In these conditions, the cap 76 is replaced by a cap 100 whose dimensions are adjusted for the latter to be able to be housed inside the cavity 28. In this embodiment, the cap 100 bears mechanically on the ring 10 but does not form a composite with an anisotropic thermal expansion with the ring.

Figures 7, 8:
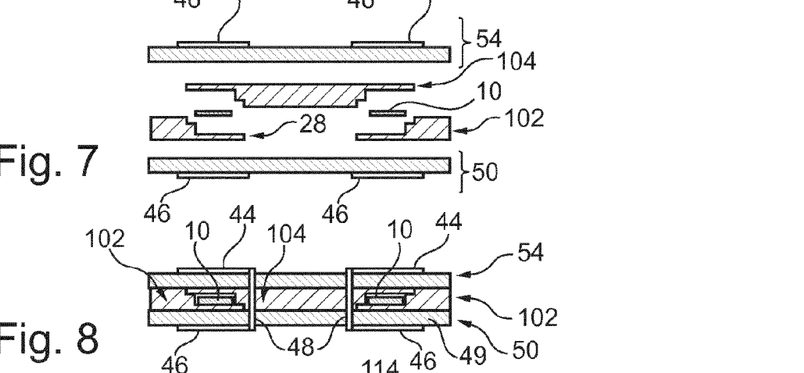
FIGS. 7 to 9 are schematic illustrations in cross section of a third embodiment of the printed circuit of FIG. 2.

FIG. 7 represents another embodiment of the printed circuit 6 in an exploded view. This embodiment is identical to that described with reference to FIG. 3, except that the insulating layer 52 is replaced by an insulating layer 102 and the cap 76 is replaced by a cap 104.

The insulating layer 102 is identical to the insulating layer 52 except that the central core of the layer 52 around which the cavity 28 is wound is replaced by a bore that passes vertically right through the insulating layer 102.

The cap 104 is identical to the cap 76 except that the central core that has been eliminated from the insulating layer 102 is now incorporated in the cap 104. The cap 104 therefore takes the form of a disk whose central core is arranged to be introduced in the bore of the insulating layer 102.

FIG. 8 represents the embodiment of FIG. 7 in the assembled position.

Figure 9:
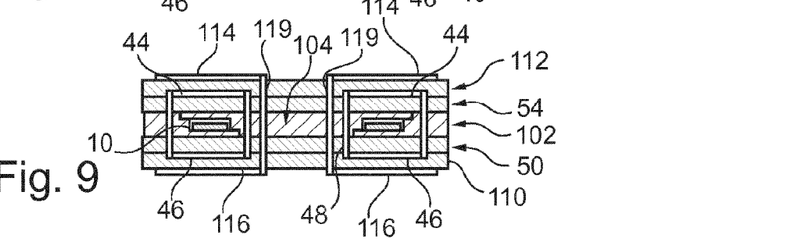

FIG. 9 represents the printed circuit of FIG. 8 after new metalized prepregs, respectively 110 and 112, have been stacked on the top and bottom outer faces of this printed circuit. This therefore makes it possible to add two metallization layers. Here, these additional metallization layers are used to form conductive tracks 114 and 116 linked by vertical vias 119 to form, for example, the turns of the measurement coil 13.

Figures 10, 11, 12, 13, 14:
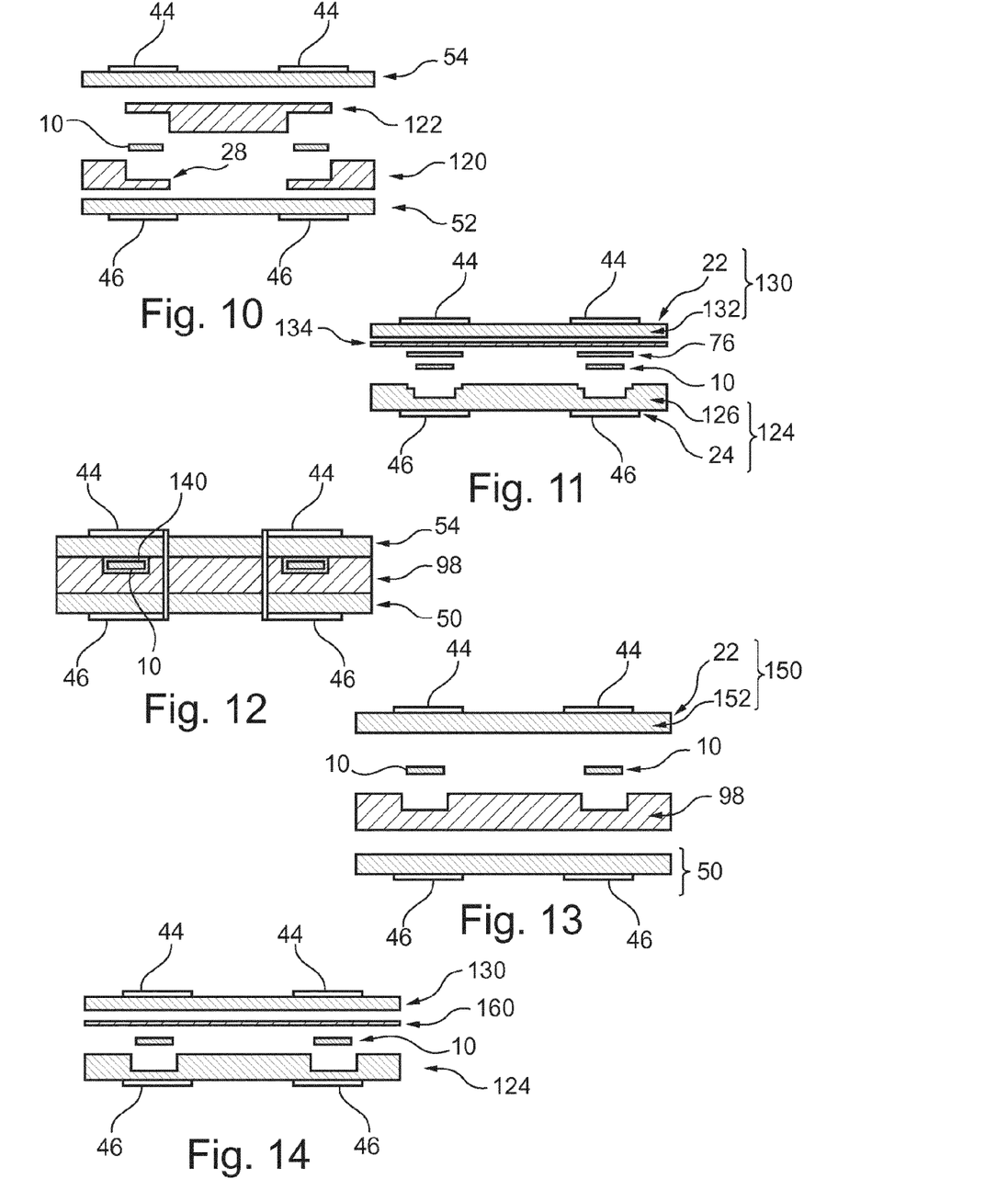
FIG. 10 is a schematic illustration, in cross section and in an exploded view, of a fourth embodiment of the printed circuit of FIG. 2.
FIG. 11 is a schematic illustration, in cross section and in an exploded view, of a fifth embodiment of the printed circuit of FIG. 2.
FIG. 12 is a schematic illustration in cross section of a sixth embodiment of the printed circuit of FIG. 2.
FIGS. 13 and 14 are schematic illustrations, in cross section and in exploded views, respectively, of a seventh and of an eighth embodiment of the printed circuit of FIG. 2.

FIG. 10 represents another embodiment of the printed circuit that is identical to the embodiment of FIG. 7 except that the shoulders of the cavity 28 are omitted. In this figure, the insulating layer and the cap bear, respectively, the references 120 and 122.

FIG. 11 represents another embodiment of the printed circuit 6 identical to that described with respect to FIG. 3 except that it does not use any metalized prepreg but instead uses metalized insulating layers. More specifically, the metalized prepreg 50 and the insulating layer 52 are replaced by a metalized insulating layer 124. The metalized insulating layer 124 comprises an insulating layer 126 on the bottom face of which is fixed the metallization layer 24. The prepreg 54 is replaced by a metalized insulating layer 130 formed from the metallization layer 22 and from an insulating layer 132. The metalized insulating layers 130 and 124 are assembled with one another using a prepreg 134 covering all of the top face of the insulating layer 126.

Figure 5:
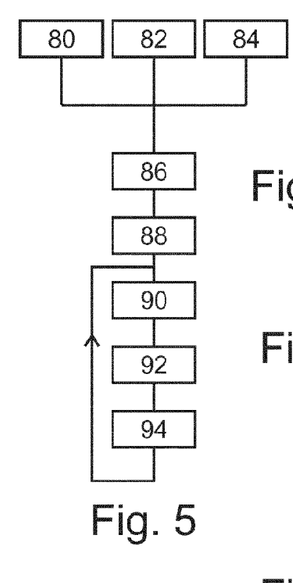
FIG. 5 is a flow diagram of a method for fabricating the printed circuit of FIG. 2.

The fabrication of this embodiment of the printed circuit 6 is identical to that described with respect to FIG. 5 except that, in the assembly step 90, the prepreg 134 is introduced between the insulating layers 124 and 130 to produce the bonding of these metalized insulating layers.

FIG. 12 represents another embodiment of the printed circuit 6 identical to that described with reference to FIG. 6 except that, in this embodiment, the cap 76 is replaced by a cap 140. The cap 140 is produced in a soft material. As used herein, a soft material is one with a Young's modulus less than 0.1 GPa.

In this embodiment, the insertion of the cap on the magnetic ring 10 consists in pouring the soft material into the cavity 28 on the ring 10. When it is poured, the viscosity of this material is low enough for the latter to entirely fill the gaps i and j without exerting any mechanical stress on the ring 10. Typically, the material used to produce the cap 140 is a non-thermosetting flexible resin. The chosen resin is also able to withstand the printed circuit fabrication temperatures. One example of such a resin is silicone. The rigidity of this material 140 is sufficiently low for it to avoid exerting any mechanical stresses on the magnetic ring 10 and for it to avoid forming, with the latter, a composite with anisotropic thermal expansion that would be likely to deform the ring 10 in response to temperature variations. Once the cap 140 has been poured into the cavity 28, the rest of the fabrication steps are identical to those described with reference to FIG. 5.

FIG. 13 represents an embodiment of the printed circuit 6 that is identical to that of FIG. 6 except that the cap 100 is omitted. In this embodiment, the metalized prepreg 54 is replaced by a metalized prepreg 150. The metalized prepreg 150 is identical to the prepreg 54 except that the prepreg 60 is replaced by a prepreg 152. The prepreg 152 exhibits a viscosity at the glass transition temperature at least ten times and, preferably, twenty times greater than the viscosity of the prepreg 60 when measured in the same conditions. For example, the prepreg 152 comprises only a thermosetting resin with a viscosity greater than 10,000 pascal-seconds and, preferably, greater than 20,000 pascal-seconds at the glass transition temperature when its temperature is raised in accordance with the specifications of the manufacturer. For example, the temperature is raised by 5° C/minute. The viscosity of a prepreg can also be measured in "mils" or in millimeters. For this, a hole of 1 inch diameter (0.03 meters) is hollowed out in the prepreg. Then, insulating layers are assembled with this prepreg in the same conditions as those that are applied in the step 90. During the assembly, the prepreg creeps and reduces the diameter of the hole. The difference between the diameter of the hole before assembly and the average diameter of the hole after assembly constitutes a measurement of the viscosity of the prepreg. This difference is expressed in "mil" ($2.54*10^{-5}$ meter) or in millimeters. The viscosity of the prepreg 152 measured according to this method is typically less than 3.5 mm and, preferably, less than 2 mm or 1.5 mm. For example, the prepreg 152 is one from the family of reference 37N sold by the company ARLON®. For example, it is the one bearing the reference 37N0 666.

Such a prepreg is known by the term "no-flow prepreg." The prepreg 152 forms the anti-creep means. In practice, given the very high viscosity of this prepreg even during assembly, the latter cannot flow as far as the magnetic ring 10 even in the absence of a cap.

The fabrication of this embodiment is identical to that described with reference to FIG. 5 except that the fabrication of the cap and the deposition of this cap can be omitted.

FIG. 14 represents an embodiment of the printed circuit 6 identical to that described with reference to FIG. 11, except that the prepreg 134 is replaced by a prepreg 160. The prepreg 160 is a no-flow prepreg, for example identical to the prepreg 152. In these conditions, the cap 76 can be omitted since the high viscosity of this prepreg 160 during the assembly prevents it from flowing as far as the ring 10.

Figure 15:
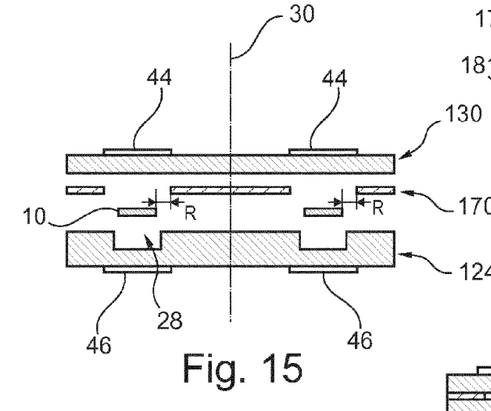
FIG. 15 is a schematic illustration, in cross section and in an exploded view, of a ninth embodiment of the printed circuit of FIG. 2.

The embodiment of FIG. 15 is identical to the embodiment of FIG. 11 except that the cap 76 and the shoulders are omitted and that the prepreg 134 is replaced by a prepreg 170. The prepreg 170 is represented in more detail in FIG. 16. The prepreg 170 is identical to the prepreg 134 except that it includes openings produced in such a way as to be located facing the mouth of the cavity 28 during assembly. For example, here, it includes four openings 172 to 175, each in the form of a portion of a ring, and centered on the axis of revolution 30.

Figure 16:
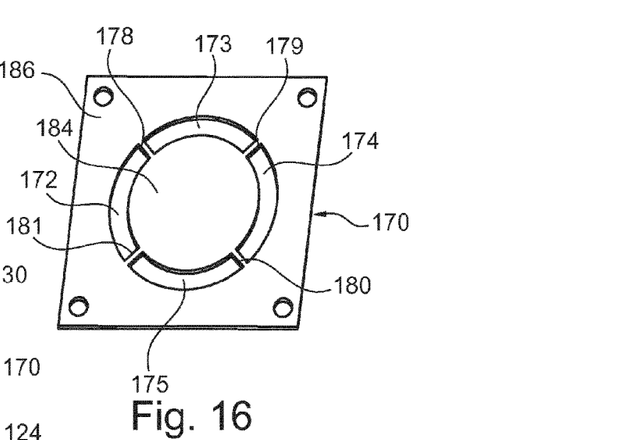
FIG. 16 is a schematic illustration in perspective of a prepreg used in the embodiment of FIG. 15.

The transversal width of each of these openings is equal to the width of the mouth of the cavity 28 in the top face 66, to which is added an offset margin. The offset margin is such that the prepreg 170 does not extend as far as the lips of the mouth of the cavity 28 during assembly. Thus, before assembly, the edges of the openings 172 to 175 are offset, in a radial direction, relative to the lips of the mouth of the cavity 28 by a distance R. The distance R is determined, for example by trial and error, so that, during assembly, the prepreg 170 cannot flow as far as the magnetic ring 10. The distance R is, for example, greater than or equal to 100 µm and, preferably, greater than or equal to 200 µm or 300 µm or 1 mm. Thus, these openings 172 to 175 form anti-creep means.

The prepreg 170 also comprises bridges 178 to 181 distributed at regular intervals around the axis 30 in order to mechanically link a central core 184 of the prepreg 170 to the periphery 186 of the prepreg 170. The width of these bridges 178 to 181 is chosen such that their aggregate surface area is less than 20% and, preferably, less than 10 or 5% of the surface area of the top face of the ring 10.

In these conditions, even if these bridges are, during assembly, made to creep as far as the magnetic ring 10, the covered surface area of the ring 10 is small enough not to create mechanical stresses likely to significantly disrupt the operation of the sensor 2.

Figure 17:
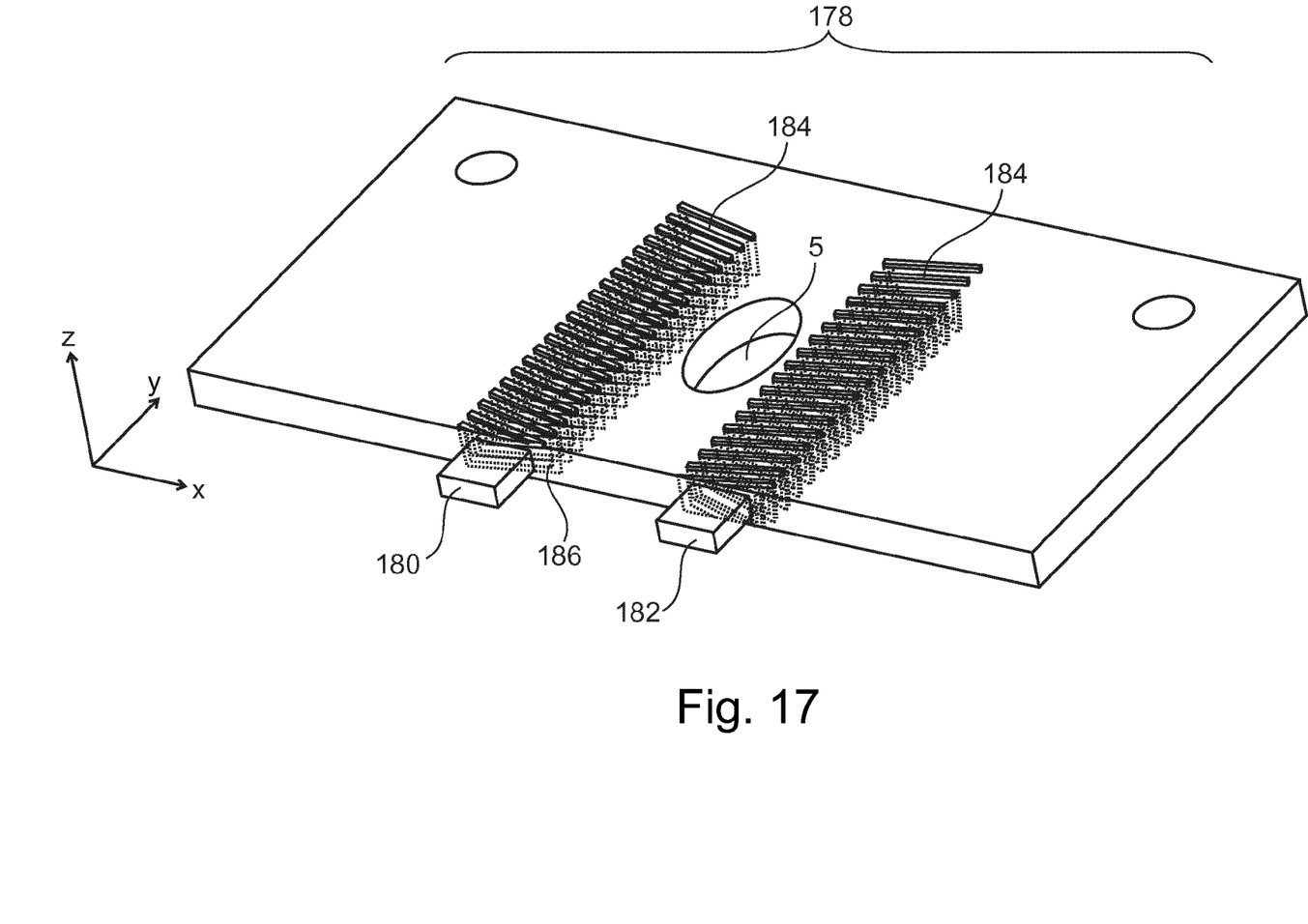
FIG. 17 is a schematic illustration, in cross section and in perspective, of another embodiment of the printed circuit of the sensor of FIG. 1.

FIG. 17 represents a printed circuit 178 that can be used in place of the circuit 6. This circuit 178 is identical to the printed circuit 6 except that the magnetic ring 10 is replaced by two magnetic bars 180 and 182. It therefore comprises anti-creep means as described previously. These magnetic bars are parallelepipeds that are arranged parallel to one another in the Y direction. To clarify FIG. 17, the bars are shown protruding beyond the circuit 178 but, in reality, they are entirely housed inside this circuit. For example, the thickness and the width of these bars 180 and 182 are identical to those of the ring 10. The length of the bars 180 and 182 in the Y direction is typically between 5 and 60 mm. An excitation coil and a measurement coil are wound around each of these bars 180, 182. These coils are produced as described for the printed circuit 6. The top and bottom conductive tracks of the excitation coils bear the references, respectively, 184 and 186 in FIG. 17. The measurement coils and the processing unit 18 are not represented to simplify the illustration.

The operation of a current sensor produced using the printed circuit 178 is similar to that of the sensor 2. However, the use of bars rather than a ring makes it possible to measure a current of greater intensity while retaining a reduced footprint.

Figure 18:
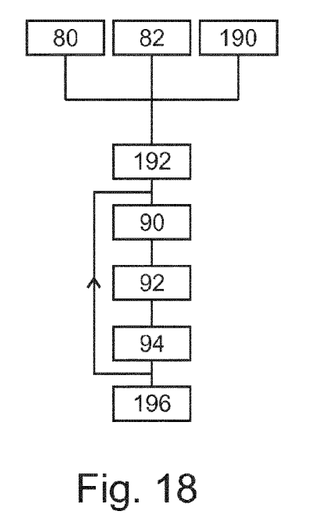
FIG. 18 is a flow diagram of a method for fabricating the printed circuit of FIG. 17.

FIG. 18 represents a method for fabricating the printed circuit 178.

This fabrication method is identical to that described with reference to FIG. 5 except that the magnetic ring 10 is replaced by two magnetic bars and a temporary block is used during assembly.

More specifically, step 84 is replaced by step 190, which includes fabrication of two temporary blocks 191 (FIG. 19) that have dimensions greater than or equal to those of the magnetic bars 180 and 182 and strictly less than the dimension of the cavity 28 in which these bars are received.

Step 86 is replaced by step 192 during which the temporary blocks are inserted into each of the cavities in place of the magnetic bars 180, 182.

Then, steps 90, 92 and 94 are carried out. These steps 90, 92 and 94 can be reiterated to stack more than two metallization layers.

Figure 19:
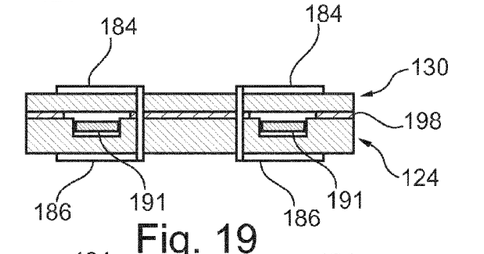
FIGS. 19 to 21 are schematic illustrations of different fabrication steps in the method of FIG. 18.
Figure 20:
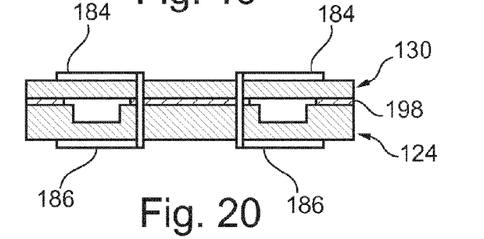

On completion of step 94, in step 196 the temporary blocks 191 are replaced by the magnetic cores 180 and 182. For this, an end of the printed circuit 178 is cut to open the ends of the cavities in which the temporary blocks 191 are housed. The state represented in FIG. 19 is then obtained. Then, the temporary blocks 191 are removed through these opened ends. The state represented in FIG. 20 is then obtained. Then, the magnetic cores 180 and 182 are inserted into their respective cavities via these same ends (FIG. 21).

Figure 21:
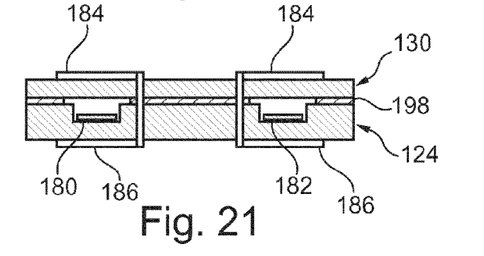

FIGS. 19 to 21 have been represented in the particular case in which the anti-creep means are produced as described with reference to FIG. 16. These means are therefore, here, an open work prepreg 198 in which openings are formed facing the cavity to prevent the flow of this prepreg to the magnetic core.

Figure 22:
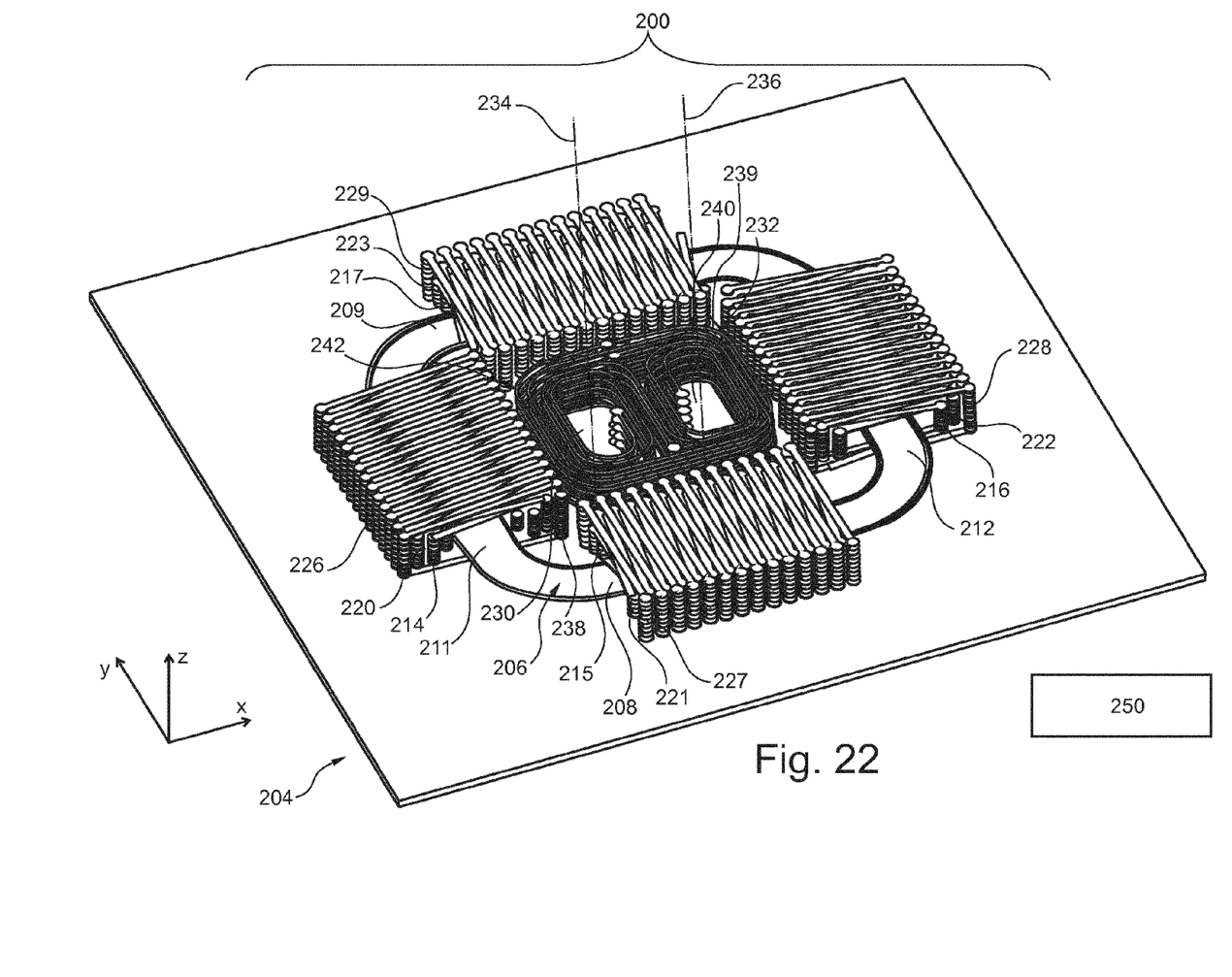
FIG. 22 is a schematic illustration in perspective of a triaxial magnetic field sensor.

FIG. 22 represents a magnetic field sensor 200. The sensor 200 is one that is sufficiently accurate so that the root mean square of the power spectral density of the noise ("RMS PSD") is less than 1 nT/√Hz or 100 pT/√Hz and, in certain configurations, less than 10 pT √Hz.

Here, this sensor 200 is a sensor familiarly known as a "fluxgate" sensor. The operation of such a sensor is well known from, for example, U.S. Pat. No. 7,372,261, the contents of which are herein incorporated by reference, and therefore need not be described further.

Hereinbelow, only the elements of this sensor that are necessary for understanding of the invention are described.

Here, the sensor is used to measure a continuous or static magnetic field. For example, this continuous magnetic field corresponds to the Earth's magnetic field.

The sensor 200 is capable of measuring the orientation, and, optionally, the intensity of an external magnetic field T. More specifically, the sensor 2 measures the components $T_X$, $T_Y$ and $T_Z$ corresponding, respectively, to the projections of the magnetic field T in three non-collinear directions X, Y and Z. In the embodiments described herein, the directions X, Y and Z are mutually orthogonal, with the Z direction being the vertical direction and the X and Y directions defining a horizontal plane.

The sensor 200 comprises a multilayer printed circuit 204. Typically, the printed circuit 204 comprises more than five metallization layers and, preferably, more than ten metallization layers. In the embodiments described herein, the printed circuit 204 comprises ten metallization layers. The metallization layers are stacked one on top of the other in the direction Z. The topmost metallization layer in the direction Z corresponds to the top face while the bottommost metallization layer corresponds to the bottom face of the printed circuit.

The printed circuit 204 comprises a magnetic ring 206 housed in a horizontal annular cavity. The ring 206 is situated between the top and bottom faces of the printed circuit. This printed circuit 204 is fabricated as described previously for the printed circuit 6. It therefore comprises, notably, one of the anti-creep structures previously described. Thus, only the main differences between this circuit 204 and the circuit 6 are underlined here.

The ring 206 comprises two bars 208 and 209 parallel to the X direction and two bars 211 and 212 parallel to the Y direction. The ends of these bars are linked to one another by a corner made of magnetic material to form the ring 206.

Four excitation coils 214 to 217 are produced in the printed circuit 204 to saturate the magnetic ring 206. An excitation current $i_{OH}$ at an excitation frequency $f_H$ passes through these excitation coils. Typically, the excitation frequency is greater than 300 Hz and preferably greater than 10 kHz. Each of the coils 214 to 217 is wound respectively around the bars 211, 208, 212 and 209.

The coils 214 to 217 are connected in series to one another so as to generate an excitation magnetic field $B_{exH}$ of the same direction when they are passed through by the current $i_{OH}$. Each coil 214 to 217 is formed by conductive tracks produced in two metallization layers of the printed circuit situated, respectively, above and below the magnetic ring 206. The ends of these conductive tracks are connected together by vertical vias to form the turns of the coils 214 to 217.

The printed circuit 204 also comprises four measurement coils 220 to 223 that are wound, respectively, around the bars 211, 208, 212, 209 to measure the magnetic field inside these bars. The measurements of the magnetic field produced by each of these coils 220 to 223 are denoted, respectively, $M_1$, $M_2$, $M_3$ and $M_4$. These measurements are given by the following relationships:

$$M_1 = T_Y - B_{exH},$$

$$M_2 = T_X + B_{exH},$$

$$M_3 = T_Y + B_{exH}, \text{ and}$$

$$M_4 = T_X - B_{exH}.$$

These relationships are given with the following convention: the excitation magnetic field $B_{ex}$ rotates in the counter-clockwise direction and the components $T_X$ and $T_Y$ are directed in the same direction as the X and Y directions respectively.

The coils 220-223 are wound around respective excitation coils 214-217. The coils 220-223 are formed by conductive tracks produced in metallization layers situated above and below those used to produce the conductive tracks of the excitation coils.

In this embodiment, four compensation coils 226-229 are also wound, respectively, around the measurement coils 220-223. These coils 226-229 make it possible to cancel the magnetic field in the respective bars 211, 208, 212, 209. In these conditions, the measurement of the components $T_X$ and $T_Y$ is deduced from the intensity of the compensation current $i_{cH}$ that circulates in these coils 226-229.

The coils 226-229 are formed by conductive tracks produced in metallization layers situated above and below those used to form the conductive tracks of the measurement coils.

Because it is a null magnetic field that is being worked with, there is reduced magnetic coupling between the measurements produced in the X and Y directions that could otherwise be provoked by the use of measurement coils that are wound around the same magnetic ring 206.

The printed circuit 204 also comprises vertical coils for measuring the component $T_Z$. As used herein, a "vertical coil" denotes a coil that is wound and extends along a vertical axis.

More specifically, two holes 230, 232 passing right through the printed circuit along, respective vertical axes 234, 236 are hollowed out in this printed circuit. These holes 230, 232 are intended to each receive a respective branch of a vertical magnetic ring. To simplify illustration, this vertical magnetic ring is omitted from FIG. 22.

Around these holes 230, 232, the printed circuit comprises two excitation coils 238, 239 specifically for generating an excitation magnetic field $B_{exv}$ capable of saturating the vertical magnetic ring when an excitation current $i_{exv}$ of frequency $f_{exv}$ passes through the coils 238, 239. In some embodiments, the current $i_{exv}$ and the frequency $f_{exv}$ are equal, respectively, to the current $i_{exH}$ and to the frequency $f_{exH}$.

A measurement vertical coil 240 surrounds the two holes 230, 232. This coil 240 is intended to measure the magnetic field in the vertical magnetic ring.

Finally, a compensation vertical coil 242 is also produced in the printed circuit 240. This compensation vertical coil 242 surrounds the holes 230, 232. As previously, the function of the compensation vertical coil 242 is to cancel the magnetic field in the vertical magnetic ring when a compensation current $i_{cv}$ passes through it.

The coils 238, 239, 240, 242 are formed by conductive tracks produced in metallization layers of the printed circuit 204. These conductive tracks are connected to one another via vertical vias to form the turns of each of these coils.

Finally, the sensor 200 comprises an electronic processing unit 250 suitable for controlling the power supply for the excitation and compensation coils and for processing the signals from the measurement coils to obtain a measurement of the magnetic field T. Typically, the measurement of each component of the magnetic field T is obtained from the amplitude of a harmonic of the excitation frequency in the magnetic field as measured by the measurement coils.

Many other embodiments are possible. For example, the insulating layer can be produced differently. In some examples, the insulating layer conforms to the standard such as FR-5, G10 or G11.

The vias can also be produced by metal rivets.

The conductive tracks can be produced by technologies other than the etching of a metallization layer. For example, the conductive tracks can equally be deposited on an insulating layer. With this latter technology, the metallization layer is the layer in which the conductive tracks are deposited.

In the embodiment of FIG. 7, the bore may not be a through bore.

The different embodiments of the anti-creep means described here can be combined with one another.

The use of a temporary block can be applied regardless of the anti-creep means used.

The method of FIG. 18 has been described in the particular case where the step 196 is situated after the step 94. However, the step 196 can also be carried out after one of the steps 90, 92 or 94.

One and the same coil can fulfill both measurement coil and excitation coil functions. This is made possible by the fact that the measurement is made on harmonics of the excitation frequency. In this case, the coils 12 and 13 are, for example, replaced by one and the same coil. The same coil can also fulfill the measurement and compensation coil functions.

The turns of the excitation and measurement coils can be interleaved as described with reference to FIG. 6 of the patent application U.S. Pat. No. 7,372,261.

As a variant, the magnetic rings and the measurement and excitation coils are produced in the same printed circuit. In this case, it is not necessary to superimpose two printed circuits produced independently of one another.

Finally, in a simplified embodiment, the magnetic ring 15 and the coils 16 and 17 are omitted. In this case, the processing unit 18 is programmed to compensate for the excitation magnetic field present in the measurement delivered by the coil 13.

The ring 10 is configured to pick up a maximum of magnetic flux generated by the conductor wire. For example, if the wire 3 is replaced by a conductive bar of a rectangular section, it is preferable to have the ring 10 be a rectangular ring.

The vertical magnetic ring housed in the holes 230, 232 can be produced using two "U"-shaped magnetic parts assembled head-to-tail or by winding a wire or a magnetic strip in the holes. In this case, preferably, the strip or the wire forms one or more turns each passing through the holes. In an alternate embodiment, two vertical and parallel magnetic bars can also replace the magnetic ring.

In the embodiment of FIG. 22, it is possible to superimpose several multilayer printed circuits in order to increase the length/width ratio of the magnetic rings, as well as the number of turns of the sensor.

In another variant, the wire 3 is formed by a rigid portion securely attached to the printed circuit. Typically, this rigid portion of the wire 3 is a vertical electrical track produced in the printed circuit. For example, this vertical electrical track is produced by metallization of the hole 5. The flexible parts of the wire 3 are then connected to this electrical track to perform the measurement of current intensity.

The invention claimed is:

1. An apparatus comprising a printed circuit, said printed circuit comprising a hole, a stack, one or more first coils, and a magnetic core, wherein said hole passes through said printed circuit board along a vertical axis to receive a conducting wire, wherein said stack comprises metallization layers vertically stacked and separated mechanically from one another by electrically insulating layers, wherein said one or more first coils fulfill functions of a first measurement coil and of a first excitation coil, wherein each first coil is provided with turns wound solely around said magnetic core, wherein said magnetic core forms a first magnetic ring surrounding said hole and extending horizontally between metallization layers of said stack, wherein each turn of each first coil is formed by two conducting tracks produced, respectively, in metallization layers situated above and below said first magnetic ring and by a first pad and a second pad, and wherein said first and second pads pass through an insulating layer, wherein said first pad passes through an interior of said magnetic ring, and wherein said first pad electrically links said two conducting tracks, wherein said second pad passes through an exterior of said magnetic ring, and wherein said second pad electrically links one of said conducting tracks to a conducting track of another turn of the first coil; wherein the apparatus further comprises at least one second magnetic ring that surrounds said hole and that extends horizontally between said metallization layers, one or more second coils fulfilling said functions of a second measurement coil and of a second excitation coil, each second coil being provided with turns wound only around said second magnetic ring, each turn of each second coil being formed by two conducting tracks produced, respectively, in said metallization layers situated above and below said second magnetic ring and linked electrically to one another by a pad passing through an insulating layer and passing through an interior of said second magnetic ring, and wherein said first and second measurement coils are linked in series so as to decrease a contribution of a magnetic excitation field in a current in said measurement coils.

2. The apparatus of claim 1, further comprising a source of excitation current suitable for causing flow in said first excitation coil of a current whose intensity causes a periodic saturation of said magnetic core, wherein said source and said printed circuit board collectively define a sensor of current in said conducting wire.

3. The apparatus of claim 1, wherein said printed circuit further comprises an annular cavity, wherein said magnetic ring is housed in said annular cavity, wherein transverse dimensions of said magnetic ring in a vertical plane are more than 5 µm smaller than said corresponding transverse dimensions of said annular cavity so as to leave a clearance between walls of said cavity and opposing faces of said magnetic ring.

4. The apparatus of claim 1, wherein said first and said second excitation coils are arranged so as to generate a magnetic excitation field in said interior, respectively, of said first and second magnetic rings of equal intensity when said coils are supplied by the same excitation current, and wherein said first and second measurement coils are arranged so as to measure said same magnetic field, respectively, in said first and second rings in the absence of said magnetic excitation field.

5. The apparatus of claim 4, wherein, with the exception of being would around said first and second magnetic rings, said first and second excitation coils are identical, and wherein, with the exception of being wound around said first and second magnetic rings, said first and second measurement coils are identical.

* * * * *